(12) United States Patent
Keller

(10) Patent No.: US 6,701,479 B2
(45) Date of Patent: Mar. 2, 2004

(54) FAST CYCLIC REDUNDANCY CHECK (CRC) GENERATION

(75) Inventor: Richard B. Keller, Vancouver, WA (US)

(73) Assignee: Network Elements, Inc., Beaverton, OR (US)

(*) Notice: Subject to any disclaimer, the term of this patent is extended or adjusted under 35 U.S.C. 154(b) by 441 days.

(21) Appl. No.: 09/858,232

(22) Filed: May 15, 2001

(65) Prior Publication Data

US 2002/0174399 A1 Nov. 21, 2002

(51) Int. Cl.$^7$ .............................................. H03M 13/00
(52) U.S. Cl. ...................................................... 714/757
(58) Field of Search ............................... 714/757, 758, 714/781

(56) References Cited

U.S. PATENT DOCUMENTS

| | | | |
|---|---|---|---|
| 5,130,991 A | * 7/1992 | Takano ........................ | 714/991 |
| 5,323,403 A | * 6/1994 | Elliott ......................... | 714/757 |
| 5,619,516 A | 4/1997 | Li et al. | |
| 5,734,826 A | * 3/1998 | Olnowich et al. ........... | 709/238 |
| 5,844,923 A | 12/1998 | Condon | |
| 6,029,186 A | * 2/2000 | DesJardins et al. ......... | 708/492 |
| 6,119,263 A | * 9/2000 | Mowbray et al. ............ | 714/781 |
| 6,128,766 A | * 10/2000 | Fahmi et al. ................ | 714/807 |

OTHER PUBLICATIONS

Monteiro et al., "Fast Configurable Polynomial Division for Error Control Coding Applications," IEEE, Jul. 2001, pp. 158–161.
Monteiro et al., "A Polynomial Division Pipelined Architecture for CRC Error Detection Codes," 13$^{th}$ International Conference on Microelectronics, Oct. 29–31, 2001, pp. 133–166.

* cited by examiner

Primary Examiner—Albert Decady
Assistant Examiner—Shelly A Chase
(74) Attorney, Agent, or Firm—Schwabe, Williamson & Wyatt, P.C.

(57) ABSTRACT

A CRC generation unit is equipped with multiple polynomial division circuits (PDC) to perform multiple different bit lengths polynomial divisions in parallel, including outputting of multiple remainder values, for an iteration of an iterative CRC generation for a data block. In one embodiment, the unit also includes a selector to select one of the remainder values, and a register to store the selected remainder value, return the stored remainder value to the PDCs for formation of different bit length dividends, and output the stored remainder value of the last iteration as the generated CRC value. In one embodiment, the unit further includes alignment circuitry to align the data block. In one embodiment, multiple units are provided to generate the CRC values of successive variable length data blocks. In one embodiment, the units form a shared resource to multiple network traffic flow processing units of a network traffic routing IC.

22 Claims, 4 Drawing Sheets

Fast CRC Generator ~ 106a/106b

Data ~ 300

Alignment Unit ~ 202a/202b n x Polynomial Division Circuit ~ 204a/204b

Polynomial Division Circuit ~ 502a-502h

US 6,701,479 B2

FAST CYCLIC REDUNDANCY CHECK (CRC) GENERATION

BACKGROUND OF THE INVENTION

1. Field of the Invention

The present invention relates to the field of data processing. More specifically, the present invention relates to high speed cyclic redundancy check (CRC) generation, having special application to high speed network traffic routing, such as Gigabit Ethernet packet switching.

2. Background Information

Cyclic Redundancy Check (CRC) has long been employed as a metric to facilitate detection of data transmission error. The technique is employed in a wide variety of data processing related disciplines, including in particular, networking. The underlying mathematics including the polynomial divisions involved in the generation of a CRC value for a data block is well understood among those ordinarily skilled in the art. Various hardware as well as software implementations are known. Examples of known hardware implementations include but are not limited to the implementations available from e.g. Actel of Sunnyvale, Calif.

With advances in integrated circuit, microprocessor, networking and communication technologies, increasing number of devices, in particular, digital computing devices, are being networked together. Devices are often first coupled to a local area network, such as an Ethernet based office/home network. In turn, the local area networks are interconnected together through wide area networks, such as ATM networks, Frame Relays, and the like. Of particular notoriety is the TCP/IP based global inter-networks, Internet.

As a result of this trend of increased connectivity, increasing number of applications that are network dependent are being deployed. Examples of these network dependent applications include but are not limited to, email, net based telephony, world wide web and various types of e-commerce. Successes of many of these content/service providers as well as commerce sites depend on high speed delivery of a large volume of data. As a result, high speed networking, which in turn translates into high speed CRC generation is needed.

Unfortunately, the current generation of CRC generators known in the art are generally unable to meet the speed requirement of the next generation IC based high speed network traffic routing devices. For these IC based devices, it is not only necessary for the CRC generation resource to be sufficiently fast to keep pace with the processing of a single network traffic flow, it is further desirable that the CRC generation resource to be sufficiently efficient and fast, such that it can be shared among the various flow processing units, thereby eliminating the need to have dedicated CRC generation resource for each of the flow processing units.

Thus, a highly efficient approach to CRC generation is needed.

SUMMARY OF THE INVENTION

A CRC generation unit is equipped with multiple polynomial division circuits (PDC) to perform multiple different bit lengths polynomial divisions in parallel, including outputting of multiple remainder values, for an iteration of an iterative CRC generation for a data block. In one embodiment, the CRC generation unit also includes a selector to select one of the remainder values, and a register to store the selected remainder value, return the stored remainder value to the PDCs for formation of different bit length dividends, and output the stored remainder value of the last iteration as the generated CRC value.

In one embodiment, the CRC generation unit further includes alignment circuitry to align the data block. In one embodiment, multiple CRC generation units are provided to generate the CRC values of successive variable length data blocks.

In one embodiment, the CRC generation units form a shared resource to multiple network traffic flow processing units of a network traffic routing device.

In one embodiment, the network traffic routing device is disposed on a single integrated circuit.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention. Further, the description repeatedly uses the phrase "in one embodiment", which ordinarily does not refer to the same embodiment, although it may.

Overview

Figure 1:
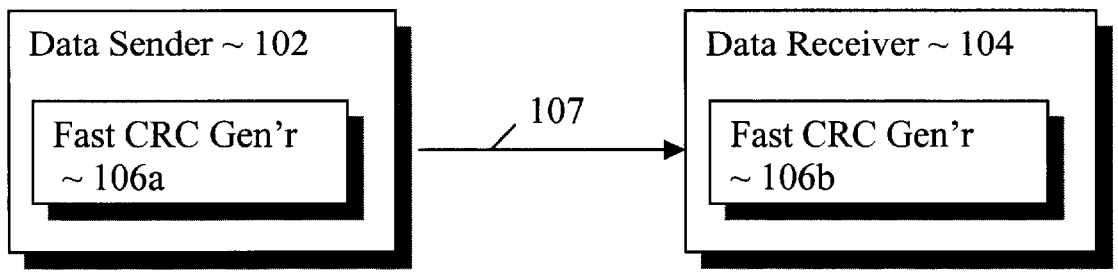
FIG. 1 illustrates an overview of the present invention.

Referring now to FIG. 1, wherein an overview of the present invention is illustrated. As shown, data sender 102 and data receiver 104 are coupled to each other via communication link 107, over which data sender 102 may send data, including associated CRC values, to data receiver 104. Both data sender 102 and data receiver 104 are equipped with fast CRC generator 106a/106b of the present invention for generating CRC values for the data blocks being sent from data sender 102 to data receiver 104. As will be described in more detail below, fast CRC generator 106a/106b includes redundant circuit elements organized in accordance with a parallel architecture to allow various calculations to be performed in an overlapped and parallel manner. As a result, fast CRC generator 106a/106b may generate CRC values of variable length data blocks, such as variable length packet data, efficiently. In fact, experience has shown that fast CRC generator 106a/106b is sufficiently efficient to allow fast CRC generator 106a/106b to be shared by as many as 64 collections of network traffic flow processing resources of an IC based gigabit Ethernet routing device, resulting in a substantial net reduction in real estate requirement (notwithstanding the duplication of certain elements to enable the overlapped and parallel computations).

Except for fast CRC generator 106a/106b, data sender 102, data receiver 104 and communication link 107 are all intended to represent a broad range of data sending, data receiving and communication systems and/or components known in the art. Accordingly, except for fast CRC generator 106a/106b, data sender 102, data receiver 104 and communication link 107 will not be otherwise further described.

Fast CRC Generator

Figure 2:
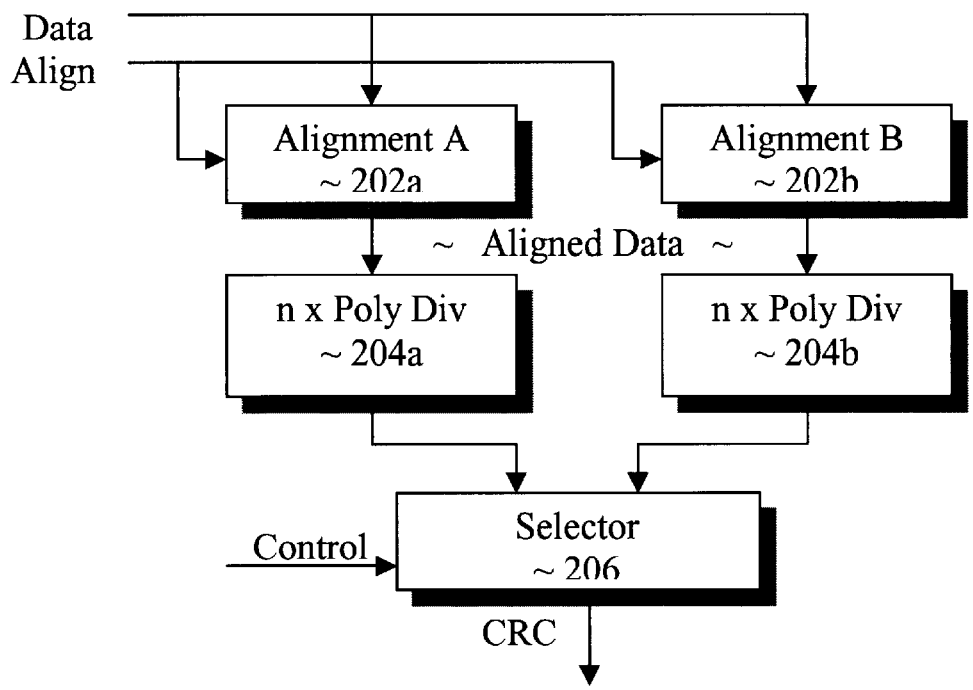
FIG. 2 illustrates one of the fast CRC generators of FIG. 1 in further detail, in accordance with one embodiment.

FIG. 2 illustrates one of fast CRC generators 106a/106b of FIG. 1 in further details, in accordance with one embodiment. As illustrated, each fast CRC generator 106a/106 includes two parallel datapaths 202a–204a and 202b–204b to facilitate overlapped CRC generation for two successive variable length data blocks. Alignment unit 202a and a collection of n×polynomial division circuits 204a form one datapath, while alignment unit 202b and another collection of n×polynomial division circuits 204b form another datapath.

Figure 3:
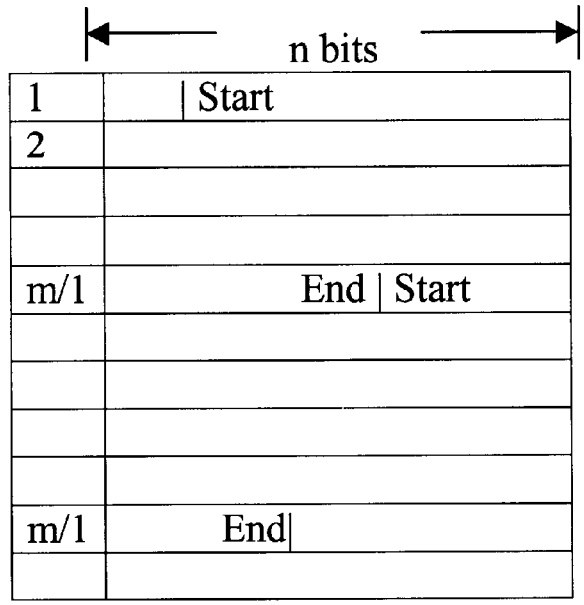
FIG. 3 illustrates an example of packet data alignment or the lack thereof.

Referring briefly to FIG. 3, wherein the alignment or the lack thereof, for successive variable length data blocks, such as variable length data packets, is illustrated. As shown, each variable length data block may be received through m groups of n-bit data groups, where m and n are integers, with m being equal to or greater than 1. Typically, m is a multiple of 8 (as most data communication as well as telecommunication protocols are defined with data sizes in multiples of bytes). Further, the starting bit of each variable length data block may be located at any bit position of the first n-bit group, and the ending bit may be located at any bit position of the last n-bit group.

Referring back to FIG. 2, accordingly as each datapath 202a–204a/202b–204b receives a variable length data block in m groups of n-bit group as earlier described, alignment unit 202a/202b aligns the data bits of the received data block, such that when the different portions of the variable data block is provided to n×polynomial division circuits 204a/204b to have its CRC value generated, the starting bit of the variable length data block is aligned to the most significant bit position of the first n bit group of the m bit groups through which the variable length data block is received.

The n×polynomial division circuits 204a/204b collectively and iteratively generate the CRC value for the aligned variable length data block in m (or m−1) iterations (depending on where the starting and the ending bits of the variable length data block is located in the first and the last n-bit group). As will be described in more detail below, each collection of n×polynomial division circuits 204a/204b includes n sets of polynomial division circuits to facilitate performance of n polynomial divisions of n different length dividends in parallel, thereby allowing the successive CRC generation to be efficiently completed with the last n-bit group having anywhere from 1 to n "residual" bits of the variable length data block.

Further, one datapath 202a–204a/202b–204b may start the iteratively generation of the CRC value for an immediately following variable length data block while the other datapath 202a–204a/202b–204b is "finishing up" its iteratively generation of the CRC value for the immediately preceding variable length data, thereby speeding up the aggregate times incurred for generating CRC values for a large number of successive variable length data blocks, as in the case of multiple network flow processing.

As illustrated, fast CRC generator 106a/106b also includes selector 206 coupled to the two datapaths 202a–204a and 202b–204b to alternate between selecting the two outputs of datapaths 202a–204a and 202b–204b for output as the CRC values of the successive variable length data blocks.

Alignment Circuit

Figure 4:
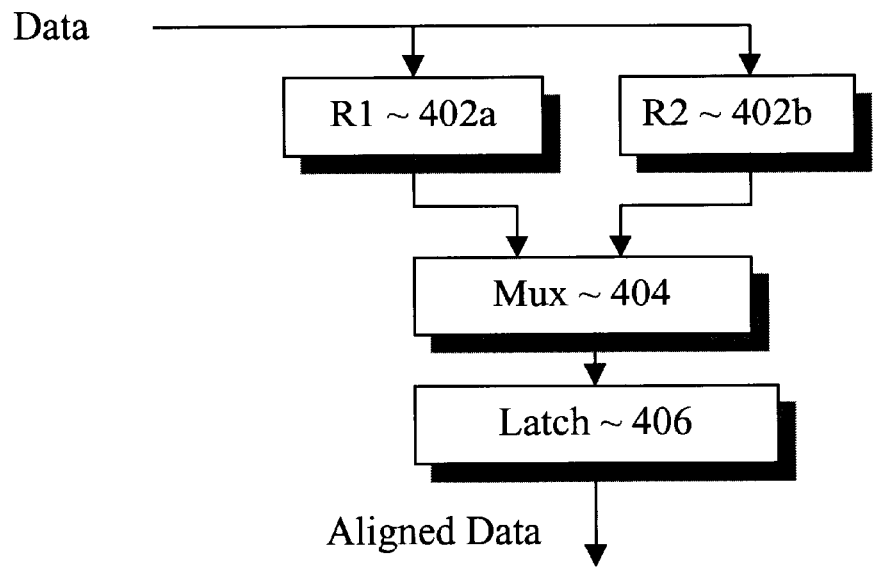
FIG. 4 illustrates one of the alignment units of FIG. 2 in further detail, in accordance with one embodiment.

FIG. 4 illustrates one of alignment units 202a/202b of FIG. 2 in further details, in accordance with one embodiment. As illustrated, each of alignment units 202a/202b includes two registers R1 402a and R2 402b for storing two successive n-bit groups. Each alignment unit 202a/202b also includes multiplexor 404 coupled to registers R1 402a and R2 402b to select an appropriate number of bits from each of the two stored successive n-bit groups to form an aligned n-bit group, and output the selected bits. Each alignment unit 202a/202b further includes latch 406 to store an aligned n-bit group for output for the corresponding collection of n×polynomial division circuits 204a/204b.

N×Polynomial Division Circuits

Figure 5:
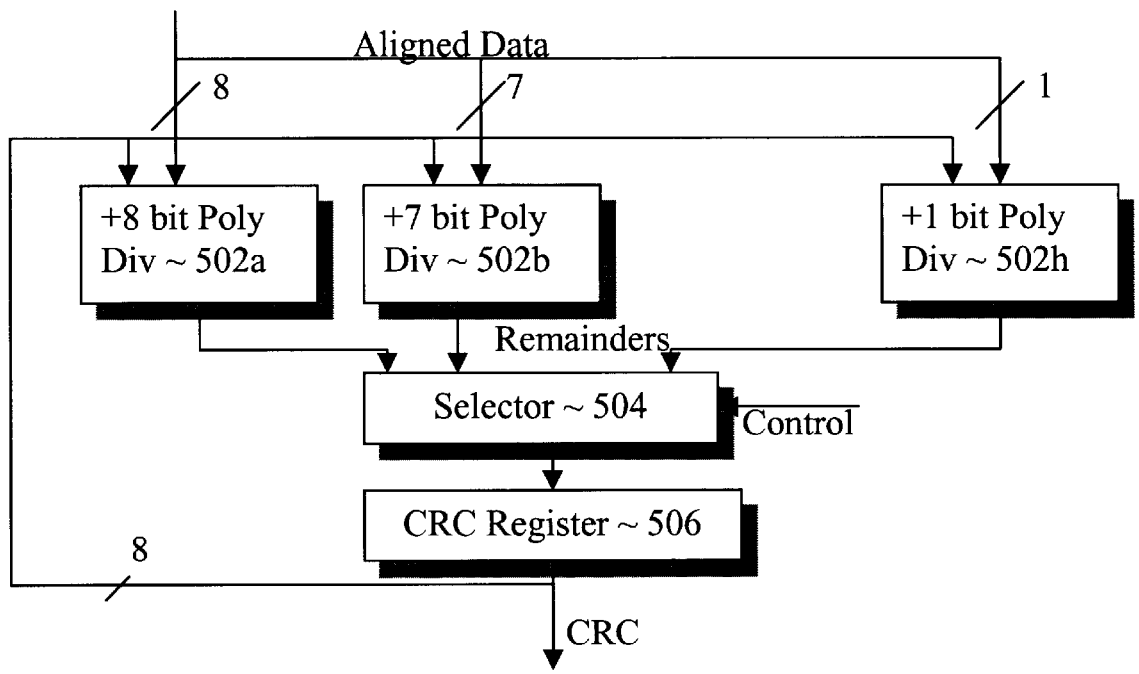
FIG. 5 illustrates one of the nxpolynomial division circuits of FIG. 2 in further detail, in accordance with one embodiment.

FIG. 5 illustrates one collection of the n×polynomial division circuits 204a/204b of FIG. 2 in further details, in accordance with one embodiment. As illustrated, each collection of n×polynomial division circuits 204a/204b includes n polynomial division circuits 502a–502h (n=8 for the embodiment) and selector 504, with polynomial division circuits 502a–502h coupled in parallel to selector 504. Each of polynomial division circuits 502a–502h is employed to perform a polynomial division of a multi-bit dividend by the predetermined generator polynomial for each iteration of an iterative generation of a CRC value. The multi-bit dividend for each iteration is formed by combining the remainder value of the immediately preceding iteration with an additional 1 to 8 input bits, to account for the possibility that the next group of bits to be processed are the last group of bits of the variable length data block and that the size of this last group of bits may be 1 or more bits, up to 8 bits. According, for each of the polynomial division circuits 502a–502b, the multi-bit dividend is different. For the illustrated n=8 embodiment, the multi-bit dividends are 16, 15, 14, 13, 12, 11, 10 and 9 respectively (the 8-bit remainder value of the immediately preceding iteration combined with 8, 7, 6, 5, 4, 3, 2, 1 bit of the next bit group).

Selector 504 is employed to select one of the remainder value outputs of the n polynomial division circuits 502a–502h, and to output the selected remainder value for CRC register 506. For most of the iterations, the remainder value selected is the remainder value outputted by polynomial division circuit 502a, until the last iteration, where the remainder value selected is the remainder value outputted by the appropriate one of polynomial division circuits 502a–502h corresponding to the number of residual bits of the variable length data block included in the processed bit group.

CRC register 506 stores the remainder value selected at each iteration, and in turn, outputs it for the polynomial division circuits 502a–502h to form the new multi-bit dividends of the next iteration of the CRC generation, as described earlier. Eventually, the stored remainder value of the last iteration is outputted as the CRC value of the variable length data block.

A Polynomial Division Circuit

Figure 6:
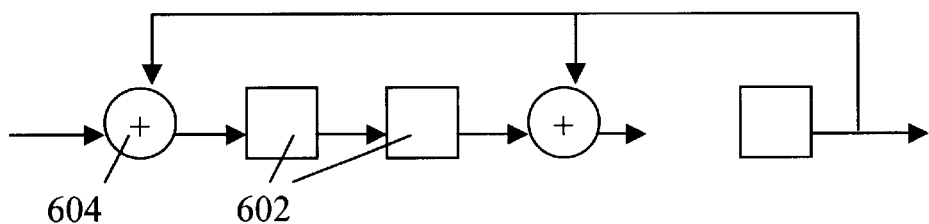
FIG. 6 illustrates one of the polynomial division circuits of FIG. 5 in further detail, in accordance with one embodiment.

FIG. 6 illustrates one of polynomial division circuits 502a/502h of FIG. 5 in further details, in accordance with one embodiment. As illustrated, each one of polynomial division circuits 502a/502h includes a number of registers 602 and a number of XOR gates 604 serially coupled to each other. For the 8-bit embodiment of FIG. 5, the number of registers 602 are 16, 15, 14 . . . and 9 for the corresponding polynomial division circuits 502a–502h. The number and the placement of XOR gates 604 are dependent on the number of terms in the predetermined generator polynomial (the divisor polynomial). For example, if the predetermined generator polynomial is $x^5+x^3+1$, there will be three XOR gates 604 disposed in the locations corresponding to the terms $x^5$, $x^3$, and $x^0$ respectively.

Example Application

Figure 7:
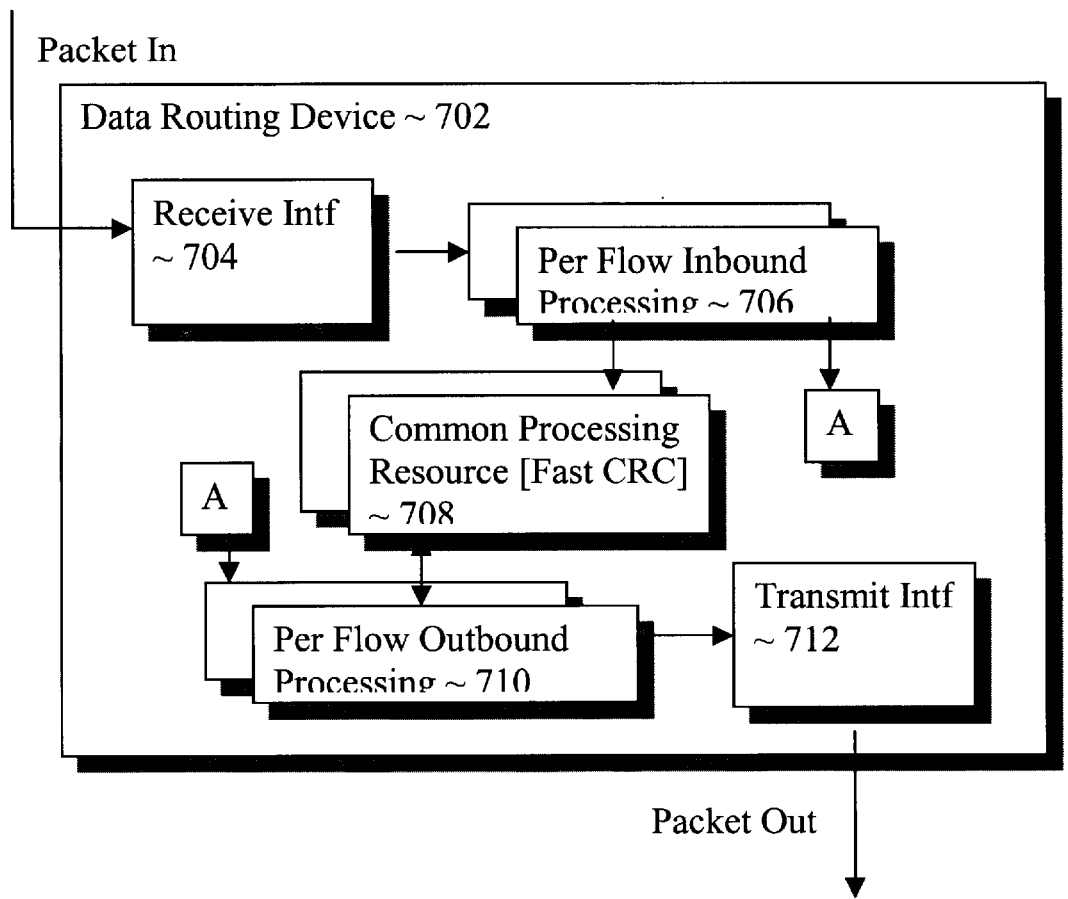
FIG. 7 illustrates an example routing device incorporated with the fast CRC generation teaching of the present invention.

FIG. 7 illustrates an example application of the fast CRC generator of the present invention. As illustrated, data routing device 702 comprising receive interface 704 and transmit interface 712 is advantageously provided with a number of per flow inbound processing units 706 and a number of per flow outbound processing functions 710. Examples of these per flow inbound and outbound processing functions may include but are not limited to deciphering and ciphering functions. Additionally, data routing device 702 may also include a number of other common or shared function units 708.

For the illustrated embodiment, common/shared function units 708 include in particular a shared CRC generation function block, incorporated with the dual datapath architecture fast CRC generator of FIG. 2. Moreover, each collection of n×CRC polynomial circuits includes n polynomial division circuits as architected in FIG. 4. Accordingly, the common/shared CRC generator may alternate between generating CRC values for different data packets of the different flows being processed by per flow inbound/outbound processing units 708/710.

As a result, the amount of storage required for provisioning the CRC function for the various flows being processed in parallel is substantially reduced under the present invention. In turn, data routing device 702 may be advantageously disposed on a single integrated circuit. Thus, data routing device 702 is able to handle high speed line rate data packet switching for multiple data flows at the same time. In one embodiment, data routing device 702 is an IC component for routing packets transmitted over an optical medium onto an electrical medium at very high speed.

Conclusion and Epilogue

Thus, it can be seen from the above descriptions, a novel highly efficient method and apparatus for generating CRC for data blocks or data packets has been described. While the present invention has been described in terms of the above described embodiments, those skilled in the art will recognize that the invention is not limited to the embodiments described. The present invention can be practiced with modification and alteration within the spirit and scope of the appended claims. Thus, the description is to be regarded as illustrative instead of restrictive on the present invention.

What is claimed is:

1. An apparatus comprising:
   a plurality of polynomial division circuits to perform a plurality of different bit lengths polynomial divisions in parallel, including outputting a plurality of remainder values, for an iteration of an iterative CRC generation for a data block;
   a selector coupled to the plurality of polynomial division circuits to select one of said remainder values outputted for the iteration of said iterative CRC generation; and
   a register coupled to the selector and the polynomial division circuits to store the selected remainder value of the iteration, and to output the stored remainder value to the polynomial division circuits for use by the polynomial division circuits to form a plurality of different bit lengths dividends for the polynomial division circuits for a next iteration of the iterative CRC generation for the data block.

2. The apparatus of claim 1, wherein the data block is received through m groups of n-bit groups with the starting bit of the data block being located in one of the n-bits of the first n-bit group and the ending bit of the data block being located in one of n-bits of the last n-bit group, where m and n are integers greater than or equal to 1, and the apparatus further comprises an alignment unit coupled to polynomial division circuits to align the data block, such that the data block is provided to the polynomial division circuits through m groups of n-bit groups, but with the starting bit being located at the first bit of the first n-bit group.

3. The apparatus of claim 2, wherein n is an integer selected from a group of integers consisting of integers that are powers of 2.

4. The apparatus of claim 1, wherein each of the polynomial division circuits further includes an additional different plurality of input bit lines to receive a different number of input bits to be concatenated with the remainder value of an immediate prior iteration outputted from the register to form a dividend of different bit length for the next iteration of the iterative CRC generation for the data block.

5. The apparatus of claim 1, wherein the apparatus is disposed on an integrated circuit.

6. An apparatus comprising:
   a first plurality of polynomial division circuits to perform a first plurality of different bit lengths polynomial divisions in parallel, including outputting a first plurality of remainder values, for an iteration of a first iterative CRC generation for a first variable length data block;
   a first selector coupled to the first plurality of polynomial division circuits to select one of said first remainder values outputted for the iteration of said first iterative CRC generation;
   a first register coupled to the first selector and the first polynomial division circuits to store the selected remainder value of the iteration, and to output the stored remainder value to the first polynomial division circuits for use by the first polynomial division circuits to form a first plurality of different bit lengths dividends for the first polynomial division circuits for a next iteration of the first iterative CRC generation for the first variable length data block;
   a second plurality of polynomial division circuits to perform a second plurality of different bit lengths polynomial divisions in parallel, including outputting a second plurality of remainder values, for an iteration of a second iterative CRC generation for a second variable length data block immediately following said first variable length data block;

a second selector coupled to the second plurality of polynomial division circuits to select one of said second remainder values outputted for the iteration of said second iterative CRC generation;

a second register coupled to the second selector and the second polynomial division circuits to store the selected remainder value of the iteration, and to output the stored remainder value to the second polynomial division circuits for use by the second polynomial division circuits to form a second plurality of different bit lengths dividends for the second polynomial division circuits for a next iteration of the second iterative CRC generation for the second variable length data block.

7. The apparatus of claim 6, wherein each of said first and second variable length data blocks is received through m groups of n-bit groups with the starting bit of the first/second variable length data block being located in one of the n-bits of the first n-bit group and the ending bit of the data block being located in one of n-bits of the last n-bit group, where m and n are integers greater than or equal to 1, and the apparatus further comprises a first and a second alignment unit correspondingly coupled to the first and second polynomial division circuits to align the first and the second variable length data block, such that each of the first/second variable length data block is provided to the first/second polynomial division circuits through m groups of n-bit groups, but with the starting bit being located at the first bit of the first n-bit group.

8. The apparatus of claim 6, wherein each of the first/second polynomial division circuits further includes an additional different plurality of input bit lines to receive a different number of input bits to be concatenated with the remainder value of an immediate prior iteration outputted from the first/second register to form a first/second dividend of different bit length for the next iteration of the first/second iterative CRC generation for the first/second variable length data block.

9. The apparatus of claim 6, wherein the apparatus is disposed on an integrated circuit.

10. An apparatus comprising:

first alignment unit to align a first variable length data block received in first m groups of n-bit groups with the starting bit of the first variable length data block being located in one of the n-bits of the first n-bit group of the first m groups and the ending bit of the first variable length data block being located in one of n-bits of the last n-bit group of the first m groups, where m and n are integers greater than or equal to 1;

a first CRC generation unit coupled to the first alignment unit to iteratively generate a first CRC value for the first variable length data block, the first CRC generation unit including a first plurality of polynomial division circuits to perform a first plurality of polynomial divisions for a plurality of different length dividends in parallel for each iteration of the first iterative generation of the first CRC value of the first variable length data block;

second alignment unit to align a second variable length data block immediately following the first variable length data block, received in second m groups of n-bit groups with the starting bit of the second variable length data block being located in one of the n-bits of the first n-bit group of the second m groups and the ending bit of the second variable length data block being located in one of n-bits of the last n-bit group of the second m groups; and a second CRC generation unit coupled to the second alignment unit to iteratively generate a second CRC value for the second variable length data block, the second CRC generation unit including a second plurality of polynomial division circuits to perform a second plurality of polynomial divisions for a plurality of different length dividends in parallel for each iteration of the second iterative generation of the first CRC value of the second variable length data block.

11. The apparatus of claim 10, wherein the first/second CRC generation unit further comprises:

a first/second selector coupled to the first/second plurality of polynomial division circuits to select one of first/second plurality remainder values outputted for an iteration of the first/second iterative CRC generation; and a first/second register coupled to the first/second selector and the first/second polynomial division circuits to store the selected remainder value of the iteration, and to output the stored remainder value to the first/second polynomial division circuits for use by the first/second polynomial division circuits to form a first/second plurality of different bit lengths dividends for the first/second polynomial division circuits for a next iteration of the first/second iterative CRC generation for the first/second variable length data block.

12. The apparatus of claim 10, wherein the apparatus is disposed on an integrated circuit.

13. A method comprising:

aligning a first variable length data block received in first m groups of n-bit groups with the starting bit of the first variable length data block being located in one of the n-bits of the first n-bit group of the first m groups and the ending bit of the first variable length data block being located in one of n-bits of the last n-bit group of the first m groups, where m and n are integers greater than or equal to 1;

iteratively generating a first CRC value for the first variable length data block, including for each iteration, performance of a first plurality of polynomial divisions for a plurality of different length dividends in parallel;

aligning a second variable length data block immediately following the first variable length data block, received in second m groups of n-bit groups with the starting bit of the second variable length data block being located in one of the n-bits of the first n-bit group of the second m groups and the ending bit of the second variable length data block being located in one of n-bits of the last n-bit group of the second m groups; and iteratively generating a second CRC value for the second variable length data block, including for each iteration, performance of a second plurality of polynomial divisions for a plurality of different length dividends in parallel for each iteration of the second iterative generation of the first CRC value of the second variable length data block.

14. The method of claim 13, wherein each of the first/second iterative generation of the first/second CRC value for the first/second variable length data block comprises:

selecting one of first/second plurality remainder values outputted for an iteration of the first/second iterative CRC generation; and storing the selected remainder value of the iteration, and output the stored remainder value for use to form a first/second plurality of different bit lengths dividends for a next iteration of the first/second iterative CRC generation for the first/second variable length data block.

15. An apparatus comprising:

a plurality of processing units to correspondingly process a plurality of network traffic flows; and a shared CRC generation block coupled to the processing units to alternately generate a CRC value for a data block of a selected one of the network traffic flows, the shared CRC generation block including at least one CRC generation unit that iteratively generate a first CRC value for the data block of the selected one of the network traffic flows, the at least one CRC generation unit including a plurality of polynomial division circuits to perform a plurality of polynomial divisions for a plurality of different length dividends in parallel for each iteration of the iterative generation of the CRC value of the data block of the selected one of the network traffic flow.

16. The apparatus of claim 15, wherein the shared CRC generation block further comprises an alignment unit coupled to the plurality of polynomial division circuits of the at least one CRC generation unit to align the data block received in m groups of n-bit groups with the starting bit of the data block being located in one of the n-bits of the first n-bit group of the m groups and the ending bit of the data block being located in one of n-bits of the last n-bit group of the m groups, where m and n are integers greater than or equal to 1.

17. The apparatus of claim 15, wherein the shared CRC generation block further comprises:

a selector coupled to the plurality of polynomial division circuits to select one of a plurality remainder values outputted for an iteration of the iterative CRC generation; and a register coupled to the selector and the polynomial division circuits to store the selected remainder value of the iteration, and to output the stored remainder value to polynomial division circuits for use by the polynomial division circuits to form a plurality of different bit lengths dividends for the polynomial division circuits for a next iteration of the iterative CRC generation for the data block of the selected one of the network traffic flow.

18. The apparatus of claim 15, wherein the apparatus is disposed on an integrated circuit.

19. An apparatus comprising:

a plurality of processing units to correspondingly process a plurality of network traffic flows; and a shared CRC generation block coupled to the processing units to alternately generate CRC values for data blocks of a selected one of the network traffic flows, the shared CRC generation block including a first and a second CRC generation unit that iteratively generate a first and a second CRC value for a first and a second data block of the selected one of the network traffic flows, the first and second CRC generation units correspondingly including first and second plurality of polynomial division circuits to perform first and second plurality of polynomial divisions for first and second plurality of different length dividends in parallel for a first and a second iteration of a first and a second iterative generation of the first and the second CRC value of the first and second data block of the selected one of the network traffic flow.

20. The apparatus of 19, wherein the first CRC generation unit includes a first alignment unit to align the first data block received in first m groups of n-bit groups with the starting bit of the first data block being located in one of the n-bits of the first n-bit group of the first m groups and the ending bit of the first data block being located in one of n-bits of the last n-bit group of the first m groups, where m and n are integers greater than or equal to 1; and the second CRC generation unit includes a second alignment unit to align the second data block, which immediately follows the first data block, received in second m groups of n-bit groups with the starting bit of the second data block being located in one of the n-bits of the first n-bit group of the second m groups and the ending bit of the second data block being located in one of n-bits of the last n-bit group of the second m groups.

21. The apparatus of claim 19, wherein the first/second CRC generation unit further comprises:

a first/second selector coupled to the first/second plurality of polynomial division circuits to select one of first/second plurality remainder values outputted for an iteration of the first/second iterative CRC generation; and a first/second register coupled to the first/second selector and the first/second polynomial division circuits to store the selected remainder value of the iteration, and to output the stored remainder value to the first/second polynomial division circuits for use by the first/second polynomial division circuits to form a first/second plurality of different bit lengths dividends for the first/second polynomial division circuits for a next iteration of the first/second iterative CRC generation for the first/second data block of the selected one of the network traffic flows.

22. The apparatus of claim 19 wherein the apparatus is disposed on an integrated circuit.

* * * * *